(12) United States Patent
Nakamura et al.

(10) Patent No.: US 7,235,915 B2
(45) Date of Patent: Jun. 26, 2007

(54) ACOUSTIC RESONATOR DEVICE, FILTER DEVICE, MANUFACTURING METHOD FOR ACOUSTIC RESONATOR DEVICE, AND COMMUNICATION APPARATUS

(75) Inventors: Hiroyuki Nakamura, Osaka (JP); Keiji Onishi, Osaka (JP); Hiroshi Nakatsuka, Osaka (JP); Tomohiro Iwasaki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 259 days.

(21) Appl. No.: 10/991,772

(22) Filed: Nov. 18, 2004

(65) Prior Publication Data

US 2005/0134147 A1    Jun. 23, 2005

(30) Foreign Application Priority Data

Nov. 18, 2003   (JP)   ............................ 2003-388362

(51) Int. Cl.
H01L 41/04   (2006.01)
H01L 41/08   (2006.01)

(52) U.S. Cl. ....................................... 310/335; 310/320
(58) Field of Classification Search ................ 310/320, 310/335
See application file for complete search history.

(56) References Cited

U.S. PATENT DOCUMENTS

| | | | |
|---|---|---|---|
| 5,373,268 A | 12/1994 | Dworsky et al. | |
| 5,646,583 A | 7/1997 | Seabury et al. | |
| 5,821,833 A * | 10/1998 | Lakin | ........................... 333/187 |
| 6,617,249 B2 * | 9/2003 | Ruby et al. | ................... 438/689 |
| 6,841,922 B2 * | 1/2005 | Aigner et al. | ................ 310/335 |
| 6,924,583 B2 * | 8/2005 | Lin et al. | ..................... 310/324 |

FOREIGN PATENT DOCUMENTS

| | | |
|---|---|---|
| EP | 1 221 770 A1 | 7/2002 |
| JP | 06-295181 A | 10/1994 |
| JP | 09-199978 A | 7/1997 |
| JP | 2002-268645 A | 9/2002 |

\* cited by examiner

*Primary Examiner*—Darren Schuberg
*Assistant Examiner*—J. San Martin
(74) *Attorney, Agent, or Firm*—RatnerPrestia

(57) ABSTRACT

An acoustic resonator device includes a substrate, a first acoustic resonator and a second acoustic resonator. The first acoustic resonator is formed on the substrate, and has a first upper electrode, a first piezoelectric layer, and a first lower electrode layer, and resonates in a $\lambda/4$ mode at a first resonant frequency. The second acoustic resonator is formed on the substrate, and has a second upper electrode layer, a second piezoelectric layer, and a second lower electrode layer, and resonates in a $\lambda/2$ mode at a second resonant frequency different from the first frequency. In the acoustic resonator device, materials and thicknesses of the first lower electrode layer and the second lower electrode layer are common and substantially equal, and materials and thicknesses of the first piezoelectric layer and the second piezoelectric layer are common and substantially equal.

6 Claims, 11 Drawing Sheets

ACOUSTIC RESONATOR DEVICE, FILTER DEVICE, MANUFACTURING METHOD FOR ACOUSTIC RESONATOR DEVICE, AND COMMUNICATION APPARATUS

BACKGROUND OF THE INVENTION

1. Field of the Invention

The present invention relates to an acoustic resonator device, which includes plural acoustic resonators having different resonance frequencies on an identical substrate, and a manufacturing method for the acoustic resonator device. For example, the invention relates to a thin-film acoustic resonator device having two resonance frequencies that are far different from each other. In addition, the invention relates to a filter device that uses an acoustic resonator, and a communication apparatus.

2. Related Art of the Invention

Components incorporated in a communication apparatus are required to be further reduced in a size and a weight. For example, a filter used in a mobile communication apparatus is required to be small in a size and adjusted precisely in frequency characteristics. In recent years, a mobile communication apparatus of a dual mode applicable to plural systems has been mainly used. Accordingly, a filter is also required to be adapted to dual mode having plural different frequencies.

Such a filter is constituted by combining plural thin-film acoustic resonators with a ladder type network.

FIG. 7(a) is a schematic sectional view of a conventional thin-film acoustic resonator. A thin-film acoustic resonator 10 includes a piezoelectric layer 1 and an upper electrode layer 2 and a lower electrode layer 3, which are provided above and below the piezoelectric layer 1, and also includes a substrate 5 below the lower electrode layer 3.

A cavity 4 is provided in the substrate 5 below the lower electrode layer 3, whereby free oscillation of the thin-film resonator 10 is secured and the thin-film resonator 10 operates as an acoustic resonator.

FIG. 7(b) is a schematic perspective view for explaining an operation of the thin-film acoustic resonator 10. When an electric field is applied between the upper electrode layer 2 and the lower electrode layer 3, electric energy is converted into mechanical energy in the piezoelectric layer 1. The thin-film acoustic resonator 10 uses resonance oscillation in a thickness direction of the piezoelectric layer 1 and operates with resonance of a frequency at which the thickness of the piezoelectric layer 1 is equal to $\lambda/2$.

Other than the thin-film acoustic resonator having the cavity 4 as shown in FIG. 7, there is known a thin-film acoustic resonator using an acoustic mirror instead of this cavity 4. As such a thin-film acoustic resonator, there are known a $\lambda/2$ mode acoustic resonator resonating at half an acoustic wavelength and a $\lambda/4$ mode acoustic resonator resonating at a quarter of the acoustic wavelength.

FIG. 8(a) is a sectional view of the $\lambda/2$ mode acoustic resonator resonating at half an acoustic wavelength that uses the acoustic mirror (e.g., see Japanese Patent Application Laid-Open No. 9-199978 (e.g., pages 3 to 4, FIG. 1)).

An acoustic mirror 12 is formed on a substrate 11, and a lower electrode layer 15, a piezoelectric layer 16, and an upper electrode layer 17 are formed on the acoustic mirror 12. A thin-film acoustic resonator 18 includes these layers as well as the substrate 11 and the acoustic mirror 12.

In the acoustic mirror 12, a low acoustic impedance layer 13 and a high acoustic impedance layer 14 are stacked on the substrate 11 alternately such that an uppermost layer is the low acoustic impedance layer 13.

The piezoelectric layer 16 has a thickness half of the acoustic wavelength of the resonance frequency. In addition, the respective low acoustic impedance layers 13 and the respective high acoustic impedance layers 14 have a thickness a quarter of the acoustic wavelength of the resonance frequency. The low acoustic impedance layer 13, which is the uppermost layer of the acoustic mirror 12, is in contact with the lower electrode layer 15.

When an electric field is applied between the upper electrode layer 17 and the lower electrode layer 15, the thin-film acoustic resonator 18 uses resonance oscillation in a thickness direction of the piezoelectric layer 16 and resonates at frequency at which the thickness of the piezoelectric layer 16 is equal to $\lambda/2$. This resonance oscillation in the thickness direction is confined in the thin-film acoustic resonator 18 by providing the acoustic mirror 12.

FIG. 8(b) is a sectional view of a $\lambda/4$ mode acoustic resonator that resonates at a quarter of the acoustic wavelength that uses the acoustic mirror (e.g., see Japanese Patent Application Laid-Open No 6-295181 (e.g., pages 3 to 7, FIG. 2)).

As in the $\lambda/2$ mode acoustic resonator shown in FIG. 8(a), an acoustic mirror 72 is formed on the substrate 11, and the lower electrode layer 15, the piezoelectric layer 76, and the upper electrode layer 17 are formed on the acoustic mirror 72. A thin-film acoustic resonator 78 includes these layers as well as the substrate 11 and the acoustic mirror 72.

In the acoustic mirror 72, the high acoustic impedance layer 14 and the low acoustic impedance layer 13 are stacked on the substrate 11 alternately such that an uppermost layer thereof is the high acoustic impedance layer 14. The $\lambda/4$ mode acoustic resonator is different from the $\lambda/2$ mode acoustic resonator shown in FIG. 8(a) in that the uppermost layer is the high acoustic impedance layer 14.

The piezoelectric layer 76 has a thickness a quarter of the acoustic wavelength of the resonance frequency. The respective low acoustic impedance layers 13 and the high acoustic impedance layer 14 have a thickness a quarter of the acoustic wavelength of the resonance frequency. The high acoustic impedance layer 14, which is the uppermost layer of the acoustic mirror 72, is in contact with the lower electrode layer 15.

When an electric field is applied between the upper electrode layer 17 and the lower electrode layer 15, the thin-film acoustic resonator 78 uses resonance oscillation in a direction of thickness of the piezoelectric layer 76 and resonates at a frequency at which the thickness of the piezoelectric layer 76 is equal to $\lambda/4$.

In addition, for example, Japanese Patent Application Laid-Open No. 2002-268645 (e.g., pages 3 to 6, FIG. 1) discloses a technique for constituting a thin-film acoustic resonator that includes plural kinds of thin-film acoustic resonators, which use an acoustic mirror as shown in FIGS. 8(a) and 8(b), on a substrate with thicknesses of piezoelectric layers changed such that resonance frequencies are slightly different from each other and has different frequencies.

FIG. 9 is a sectional view of the thin-film acoustic resonator device constituted in this way. Filters 1, 2, and 3 are formed on the identical substrate 11.

The filter 1 includes a resonator 18a. The resonator 18a includes an upper electrode layer 17a, a piezoelectric layer 161, a lower electrode layer 15a, the acoustic mirror 12, and a substrate 11 below the acoustic mirror 12.

The filter 2 includes resonators 18b and 18c. The resonator 18b includes an upper electrode layer 17b, a piezoelectric layer 162, a lower electrode layer 15b, the acoustic mirror 12, and the substrate 11 below the acoustic mirror 12. The resonator 18c includes the piezoelectric layer 162 having the same thickness as the piezoelectric layer 162 of the resonator 18b, an upper electrode layer 17c, a lower electrode layer 15c, the acoustic mirror 12, and the substrate 11 below the acoustic mirror 12.

The filter 3 includes resonators 18d and 18e. The resonator 18d includes an upper electrode layer 17d, a piezoelectric layer 163, a lower electrode layer 15d, the acoustic mirror 12, and the substrate 11 below the acoustic mirror 12. The resonator 18e includes the piezoelectric layer 163 having the same thickness as the piezoelectric layer 163 of the resonator 18d, an upper electrode layer 17e, a lower electrode layer 15e, the acoustic mirror 12, and the substrate 11 below the acoustic mirror 12.

The thicknesses of the piezoelectric layers 161, 162, and 163 are different from each other. In addition, the thicknesses of the upper electrode layers 17a, 17b, 17c, 17d, and 17e are different from each other and the thicknesses of the lower electrode layers 15a, 15b, 15c, 15d, and 15e are different from each other. By setting different thicknesses for the respective layers, a thin-film acoustic resonator device including filters having different resonance frequencies is realized. The entire disclosure of Japanese Patent Application Laid-Open No. 9-199978 (e.g., pages 3 to 4, FIG. 1)), Japanese Patent Application Laid-Open No 6-295181 (e.g., pages 3 to 7, FIG. 2)), and Japanese Patent Application Laid-Open No. 2002-268645 (e.g., pages 3 to 6, FIG. 1) are incorporated herein by reference in their entireties.

However, in the thin-film acoustic resonator device of the structure of the conventional technique shown in FIG. 9, the piezoelectric layers 161, 162, and 163 of the respective resonators have to be formed such that thicknesses thereof are different from each other and the lower electrode layers have to be formed such that thicknesses thereof are different in the lower electrode layer 15a, the pair of lower electrode layers 15b and 15c, and the pair of lower electrode layers 15d and 15e, and there are deficiencies as described below. In a thin-film acoustic resonator device, all of respective electrode layers, respective layers constituting an acoustic mirror, and piezoelectric layers are formed by a film formation process. In order to make thicknesses of the piezoelectric layers and the lower electrode layers different from each other by such a process, at least the filters 1, 2, and 3 have to be formed by different steps. However, formation of each filter affects formation of the other filers.

These deficiencies make it difficult to maintain equal performance for all acoustic resonators with resonance frequencies different from each other provided on a substrate.

SUMMARY OF THE INVENTION

The $1^{st}$ aspect of the present invention is an acoustic resonator device, comprising:

a substrate; and plural acoustic resonators that are formed on the substrate and have upper electrode layers, piezoelectric layers, and lower electrode layers, wherein all or part of the plural acoustic resonators resonate in resonance modes different from each other and at resonant frequencies corresponding to the resonance modes, and materials and thicknesses of the piezoelectric layers are common and substantially equal.

The $2^{nd}$ aspect of the present invention is the acoustic resonator device according to the $1^{st}$ aspect of the present invention, wherein materials and thicknesses of the lower electrode layers are common and substantially equal.

The $3^{rd}$ aspect of the present invention is the acoustic resonator device according to the $1^{st}$ aspect of the present invention, wherein the plural acoustic resonators are:

a first acoustic resonator that has a first upper electrode layer, a first piezoelectric layer, and a first lower electrode layer and resonates in a $\lambda/4$ mode and at a first resonant frequency; and a second acoustic resonator that is formed on the substrate, has a second upper electrode layer, a second piezoelectric layer, and a second lower electrode layer, and resonates in a $\lambda/2$ mode and at a second resonant frequency different from the first frequency.

The $4^{th}$ aspect of the present invention is the acoustic resonator device according to the $3^{rd}$ aspect of the present invention, wherein the first acoustic resonator has a first acoustic mirror that is provided between the first lower electrode layer and the substrate and has a structure in which first plural acoustic impedance layers are deposited, all the first plural acoustic impedance layers have a thickness substantially a quarter wavelength of the first resonant frequency, and among the first plural acoustic impedance layers, an acoustic impedance layer of an uppermost layer adjacent to the first lower electrode layer has an impedance higher than that of an acoustic impedance layer adjacent to an opposite side of the first lower electrode layer.

The $5^{th}$ aspect of the present invention is the acoustic resonator device according to the $3^{rd}$ aspect of the present invention, wherein the second acoustic resonator has a cavity on a surface on an opposite side of a surface of the second lower electrode layer in contact of the second piezoelectric layer.

The $6^{th}$ aspect of the present invention is the acoustic resonator device according to the $4^{th}$ aspect of the present invention, wherein the second acoustic resonator has a second acoustic mirror having a same structure as the first acoustic mirror between the second lower electrode layer and the substrate, and the cavity is provided under the second lower electrode layer of the second acoustic mirror.

The $7^{th}$ aspect of the present invention is the acoustic resonator device according to the $6^{th}$ aspect of the present invention, wherein the first acoustic mirror and the second acoustic mirror share the first plural acoustic impedance layers, and the first lower electrode layer of the first acoustic resonator and the second lower electrode layer of the second acoustic resonator are provided on an uppermost layer of an identical one of the first plural acoustic impedance layers.

The $8^{th}$ aspect of the present invention is the acoustic resonator device according to the $6^{th}$ aspect of the present invention, wherein the first acoustic mirror and the second acoustic mirror are provided on the substrate independently from each other.

The $9^{th}$ aspect of the present invention is the acoustic resonator device according to the $3^{rd}$ aspect of the present invention, wherein the second acoustic resonator has a third acoustic mirror, which has a structure in which second plural acoustic impedance layers are deposited, between the second lower electrode layer and the substrate, all the second plural acoustic impedance layers have a thickness substantially half wavelength of the second resonant frequency, and an acoustic impedance layer of an uppermost layer adjacent to the second lower electrode layer among the second plural acoustic impedance layer has an impedance lower than that of an acoustic impedance layer adjacent to an opposite side of the second lower electrode layer.

The 10$^{th}$ aspect of the present invention is a filter device that includes plural filters having different operation frequencies on one substrate, wherein the plural filters have one or plural first acoustic resonators and one or plural second acoustic resonators according to any one of the 1$^{st}$ to the 9$^{th}$ aspects of the present invention.

The 11$^{th}$ aspect of the present invention is a communication apparatus, comprising:

a transmission circuit; and a reception circuit, wherein at least one of the transmission circuit and the reception circuit uses the filter according to the 10$^{th}$ aspect of the present invention.

The 12$^{th}$ aspect of the present invention is a manufacturing method for an acoustic resonator device that includes: a substrate; and plural acoustic resonators that are formed on the substrate and have upper electrode layers, piezoelectric layers, and lower electrode layers, all or part of the plural acoustic resonators resonating in resonance modes different from each other and at resonant frequencies corresponding to the resonance modes, the manufacturing method comprising:

a step of forming all the piezoelectric layers of the plural acoustic resonators simultaneously by an identical process using an identical material such that thicknesses of the piezoelectric layers are identical.

The present invention has been devised in order to solve the conventional problems, and it is an object of the invention to provide an acoustic resonator device, in which plural acoustic resonators that have at least two resonance frequencies far different from each other and can control deterioration of performance are formed on an identical substrate, a manufacturing method for the acoustic resonator device, a filter device, and a communication apparatus.

According to the present invention, it is possible to provide an acoustic resonator device, in which plural acoustic resonators that have at least two resonance frequencies far different from each other and can suppress deterioration of performance are formed on an identical substrate, a manufacturing method for the acoustic resonator device, a filter device, and a communication apparatus.

DESIGNATION OF REFERENCE NUMERALS

Figure 1:
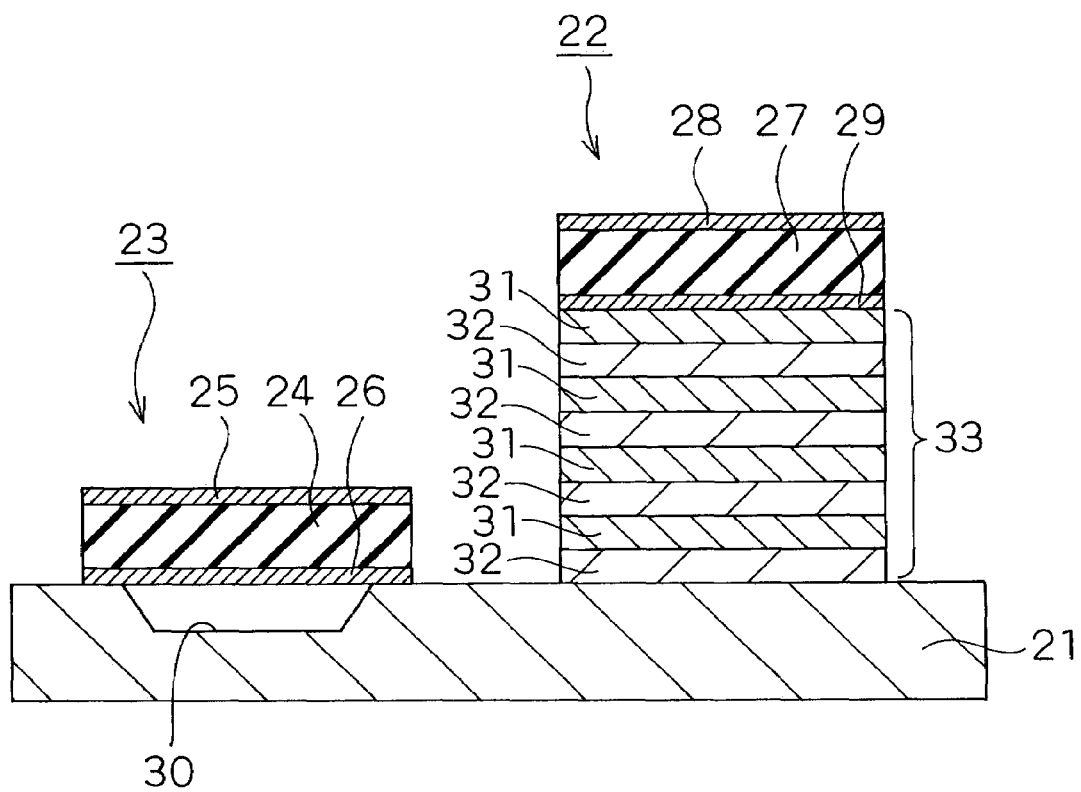
FIG. 1 is a sectional view of an acoustic resonator device according to a first embodiment of the present invention.

21 Substrate
22 First acoustic resonator
23 Second acoustic resonator
24, 27 Piezoelectric layer
25, 28 Upper electrode layer
26, 29 Lower electrode layer
30 Cavity
31 First acoustic impedance layer
32 Second impedance layer
33 First acoustic mirror

PREFERRED EMBODIMENTS OF THE INVENTION

Embodiments of the invention will be hereinafter explained with reference to the accompanying drawings.

First Embodiment

FIG. 1 is a sectional view of an acoustic resonator device including an acoustic resonator according to a first embodiment of the invention. A structure of the acoustic resonator device according to the first embodiment will be hereinafter explained together with an operation thereof.

The acoustic resonator device according to the first embodiment includes a first acoustic resonator 22 and a second acoustic resonator 23 that are acoustic resonators of the invention. The first acoustic resonator 22 and the second acoustic resonator 23 are formed on an identical substrate 21. The first acoustic resonator 22 has a first resonance frequency $f_1$ and the second acoustic resonator 23 has a second resonance frequency $f_2$.

The first acoustic resonator 22 includes a piezoelectric layer 27 and an upper electrode layer 28 and a lower electrode layer 29 that are arranged above and below the piezo electric layer 27. The upper electrode layer 28 and the lower electrode layer 29 are formed by depositing metal layers. The piezoelectric layer 27 is formed by depositing piezoelectric material layers. A thickness of the piezoelectric layer 27 is a quarter of an acoustic wavelength of the first resonance frequency $f_1$. Note that the upper electrode layer 28, the piezoelectric layer 27, and the lower electrode layer 29 are examples of a first upper electrode layer, a first piezoelectric layer, and a first lower electrode layer of the present invention, respectively.

The first acoustic resonator 22 includes, between the lower electrode layer 29 and the substrate 21, a first acoustic mirror 33 for confining wave motion of the first acoustic resonator 22 in the first acoustic resonator 22.

The first acoustic mirror 33 is constituted by alternately stacking the first acoustic impedance layer 31 and second acoustic impedance layer 32 having different acoustic impedances. The first acoustic impedance layer 31 and the second acoustic impedance layer 32 are formed of for example, glass, metal layers, ZnO, $SiO_2$, $HfO_2$, GaAs, Al, or W. Note that the first acoustic impedance layer 31 and the second acoustic impedance layer 32 are examples of first plural acoustic impedance layers of the present invention.

The first acoustic impedance layer 31 and the second acoustic impedance layer 32 have thicknesses a quarter of acoustic wavelengths corresponding to sonic velocities of materials of the first acoustic impedance layer 31 and the second acoustic impedance layer 32, respectively. In addition, an acoustic impedance of the first acoustic impedance layer 31 is higher than an acoustic impedance of the second acoustic impedance layer 32 and an uppermost layer in contact with the lower electrode layer 29 is the first acoustic impedance layer 31. With such a constitution, the first acoustic resonator 22 resonates in a $\lambda/4$ mode.

Here, it is preferable that the acoustic impedance of the first acoustic impedance layer 31 is set higher than an acoustic impedance of the piezoelectric layer 27. By setting the acoustic impedance of the first acoustic impedance layer 31 higher than the acoustic impedance of the piezoelectric layer 27, it is possible to increase reflection on the first acoustic mirror 33 and intensify confinement of energy.

In addition, it is preferable to stack the first acoustic impedance layer 31 and the second acoustic impedance layer 32 by six or more in total. Consequently it is possible to secure reflection of sound sufficiently.

The second acoustic resonator 23 includes a piezoelectric layer 24 and an upper electrode layer 25 and a lower electrode layer 26 that are arranged above and below the piezoelectric layer 24. The upper electrode layer 25 and the lower electrode layer 26 are formed by depositing metal layers. A material identical with that of the metal layers of the lower electrode layer 29 of the first acoustic resonator 23 is used for at least the metal layers of the lower electrode layer 26. The piezoelectric layer 24 is formed by depositing piezoelectric material layers of a material identical with that of the piezoelectric layer 27 of the first acoustic resonator 23. A thickness of the piezoelectric layer 24 is half the acoustic wavelength of the second resonance frequency $f_2$. Note that the upper electrode layer 25, the piezoelectric layer 24, and the lower electrode layer 26 are examples of a second upper electrode layer, a second piezoelectric layer, and a second lower electrode layer of the present invention, respectively.

In addition, the second acoustic resonator 23 includes a cavity 30, which is a cavity formed on a surface of the substrate 21, below the lower electrode layer 26. By providing the cavity 30 below the lower electrode layer 26, it is possible to secure free oscillation of the second acoustic resonator 23 and to cause the second acoustic resonator 23 to resonate in the $\lambda/2$ mode.

As described above, in the acoustic resonator device according to the first embodiment constituted as described above, the first acoustic resonator 22 resonates at $\lambda/4$ of the first resonance frequency $f_1$ and the second acoustic resonator 23 resonates at $\lambda/2$ of the second resonance frequency $f_2$. Thus, it is possible to make both the resonance frequencies far different from each other. In the first embodiment, since the thicknesses of the piezoelectric layer 24 and the piezoelectric layer 27 are substantially the same, a relation of $f_2=2\times f_1$ is satisfied and the second acoustic resonator 23 resonates at a resonance frequency about twice as large as that of the first acoustic resonator 22.

Moreover, in the structures of these acoustic resonators, the thickness of the piezoelectric layer 27 of the first acoustic resonator 22 and the thickness of the piezoelectric layer 24 of the second acoustic resonator 23 are substantially the same. In addition, the thickness of the lower electrode layer 29 of the first acoustic resonator 22 and the thickness of the lower electrode layer 26 of the second acoustic resonator 23 are substantially the same. Thus, frequency characteristics of the respective acoustic resonators do not depend upon the thicknesses of the piezoelectric layers.

Figure 10A:
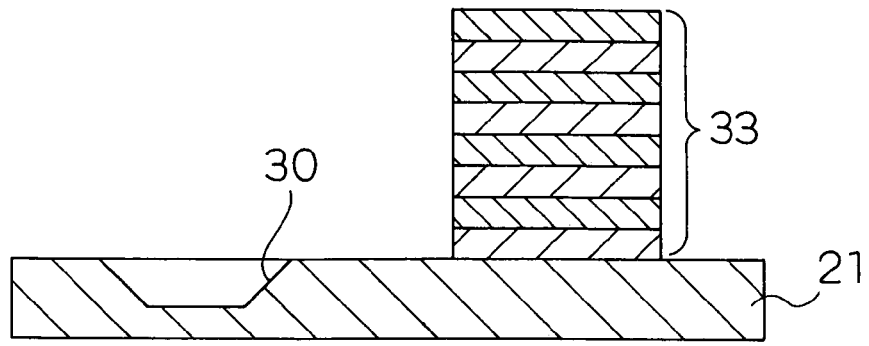
FIGS. 10(a) to 10(c) are diagrams showing a manufacturing process for the acoustic resonator device according to the first embodiment of the present invention.
Figure 10B:
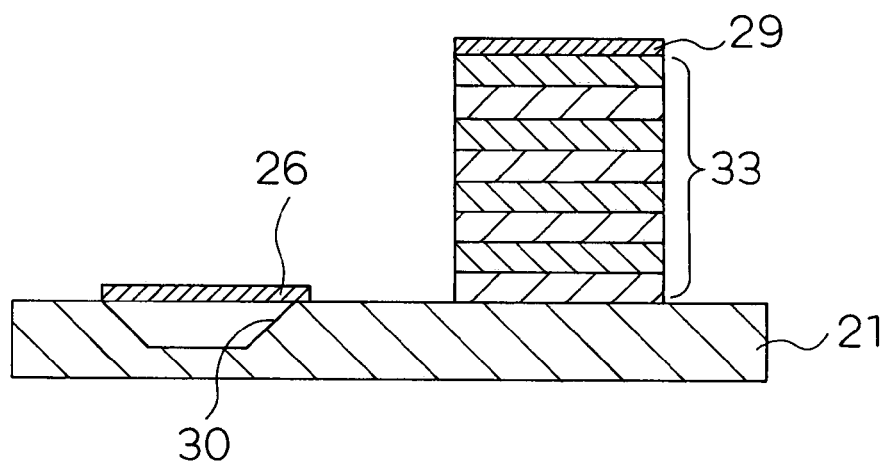
Figure 10C:
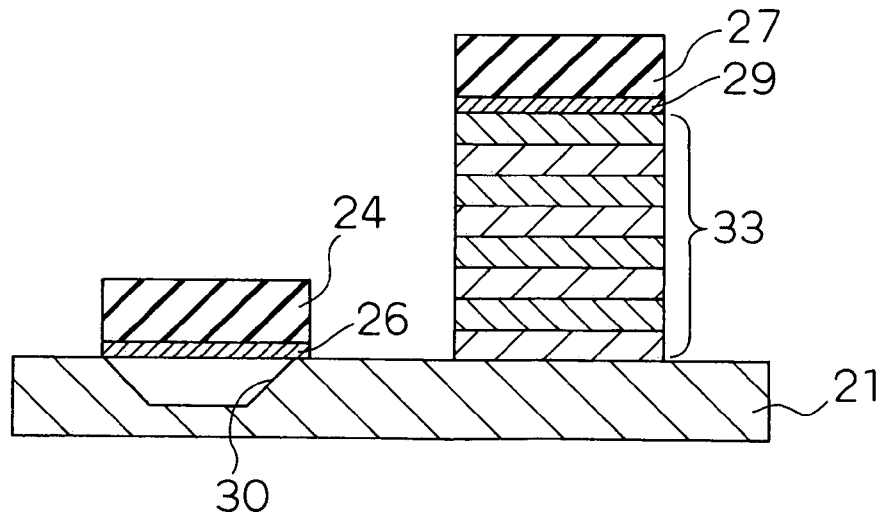

By setting the thickness of the piezoelectric layer 24 and the thickness of the piezoelectric layer 27 substantially the same and setting the thickness of the lower electrode layer 29 and the thickness of the lower electrode layer 26 substantially the same, as shown in FIGS. 10(a) to 10(c), respectively, the cavity 30 is opened, on the substrate 21 on which the first acoustic mirror 33 is formed (FIG. 10(a)), the lower electrode layer 29 and the lower electrode layer 26 are formed simultaneously by an identical process using an identical material (FIG. 10(b)), and the piezoelectric layer 24 and the piezoelectric layer 27 are formed on the lower electrode layer 29 and the lower electrode layer 26 simultaneously by an identical process using an identical material (FIG. 10(c)). Consequently, it is possible to remove qualitative fluctuation of the piezoelectric layers 24 and 27 and qualitative fluctuation of the lower electrode layers 29 and 26 and maintain performance of the first acoustic resonator 22 and the second acoustic resonator 23.

Note that the piezoelectric layers 24 and 27 are formed of, for example, AlN or ZnO and the lower electrode layers 26 and 29 are formed of, for example, Mo, Al, Cu, Au, or Tr.

In this way, this embodiment realizes formation of the first acoustic resonator 22 and the second acoustic resonator 23, which are capable of maintaining equivalent performance and have two resonance frequencies far different from each other, on the identical substrate 21.

Figure 11A:
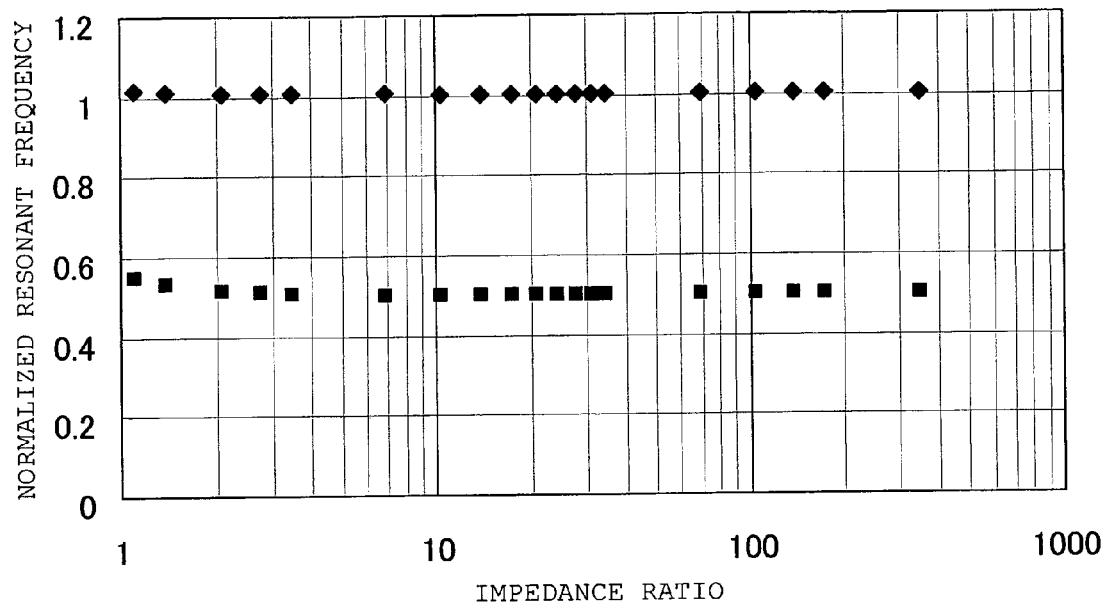
FIGS. 11(a) and 11(b) are diagrams showing a range of a resonance frequency of the acoustic resonator device according to the first embodiment of the present invention.
Figure 11B:
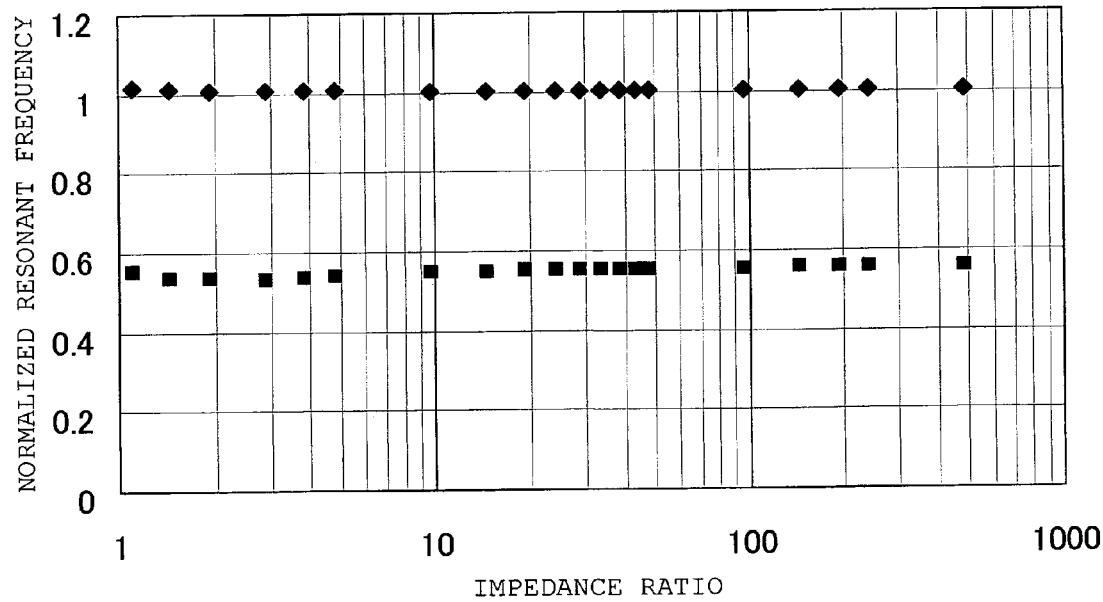

Note that, in the above explanation, the relation between the first resonance frequency $f_1$ and the second resonance frequency $f_2$ is $f_2=2\times f_1$. However, the first resonance frequency $f_1$ and the second resonance frequency $f_2$ are not limited to this but can take a desired relation, in which the first resonance frequency $f_1$ and the second resonance frequency $f_2$ are different from each other, by changing the thicknesses of the upper electrodes or providing passivation layers on the upper electrodes to combine mass load effects, for example. FIGS. 11(a) and 11(b) are diagrams showing a relation of normalized resonance frequencies that are obtained by normalizing an impedance ratio, which is obtained by dividing an impedance of the first impedance layer 31 serving as a high impedance layer by an impedance of the second impedance layer 32 serving as a low impedance layer, with a resonance frequency of free oscillation. Note that Mo is used as an electrode material and AlN is used as a material for a piezoelectric body. FIG. 11(a) indicates a case in which an Mo thickness is so small as to make it possible to neglect an influence of an electrode in an acoustic resonator and FIG. 11(b) indicates a case in which Mo is 0.2 μm thick. Note that a thickness of an AlN material is 2 μm in both cases. In the figure, a line connecting black square points indicates the resonance frequency $f_1$ of the $\lambda/4$ mode (first acoustic resonator) and a line connecting black diamond points indicates the resonance frequency $f_2$ of the $\lambda/2$ mode (second acoustic resonator).

In an example shown in FIG. 11(a), it can be confirmed that the relation of $f_2=2\times f_1$ is maintained between $f_2$ and $f_1$. In addition, in an example shown in FIG. 11(b), it can be confirmed that $f_2$ is larger than half of $f_1$. It is possible to adjust a resonance frequency by changing an electrode thickness in this way. In addition, it is desirable that the impedance ratio is 2 or more in order to select a resonance frequency stably.

In the embodiment, the lower electrode layers 26 and 29 and the substrate 21 are in direct contact with each other. However, an insulating layer made of AlN or $SiO_2$ may be provided between the lower electrode layers 26 and 29 and the substrate 21. The same holds true for embodiments to be described below.

Figure 2:
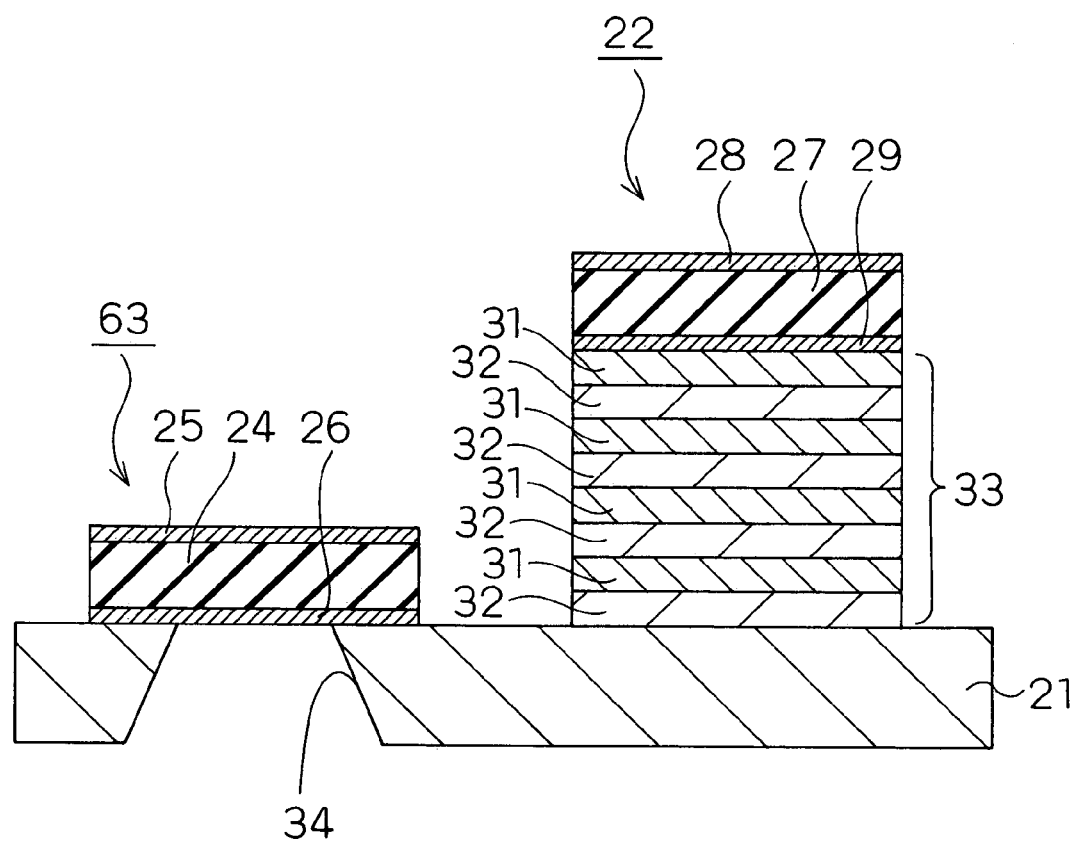
FIG. 2 is a sectional view of another example of a structure of the acoustic resonator device according to the first embodiment of the present invention.

FIG. 2 shows another example of a structure of the acoustic resonator device according to the first embodiment. The structure is different from that of the acoustic resonator device according to the first embodiment shown in FIG. 1 in a shape of a cavity included in the second acoustic resonator 23.

The cavity 30 of the second acoustic resonator 23 shown in FIG. 1 is formed on the surface of the substrate 21. However, a cavity 34 of a second acoustic resonator 63 shown in FIG. 2 is etched from the back surface of the substrate 21 to be formed so as to penetrate the substrate 21.

Note that, in the example of the structure shown in FIG. 2, components identical with or equivalent to those of the acoustic resonator device shown in FIG. 1 are denoted by the same reference numerals and an explanation of the components will be omitted.

Note that, in the first acoustic mirror 33 according to the first embodiment, the two kinds of layers, namely, the first acoustic impedance layer 31 and the second acoustic impedance layer 32 are alternately stacked. However, an acoustic mirror may have a structure in which three or more kinds of acoustic impedance layers with different acoustic impedances are stacked. Any structure of acoustic impedance layers may be adopted as long as acoustic impedance layers are stacked such that an impedance of an acoustic impedance layer is lower than both the adjacent upper and lower acoustic impedance layers or higher than both the adjacent upper and lower acoustic impedance layers. In other words, any structure of acoustic impedance layers may be adopted as long as an uppermost layer in contact with a lower electrode layer is a high acoustic impedance layer and a high acoustic impedance layer and a low acoustic impedance layer are staked alternately.

As explained above, with the structure of the first embodiment, it is possible to obtain an acoustic resonator device in which the first acoustic resonator 22 resonates in the $\lambda/4$ mode, the second acoustic resonators 23 and 63 resonate in the $\lambda/2$ mode, the thicknesses of the piezoelectric layers 27 and 24 and the thicknesses of the lower electrode layers 29 and 26 are substantially made equal, respectively, to maintain equivalent performance while resonant frequencies of thereof are made far different from each other. Note that the thicknesses of the lower electrode layers 29 and 26 may not be substantially equal. The same holds true for embodiments to be described below.

Second Embodiment

Figure 3A:
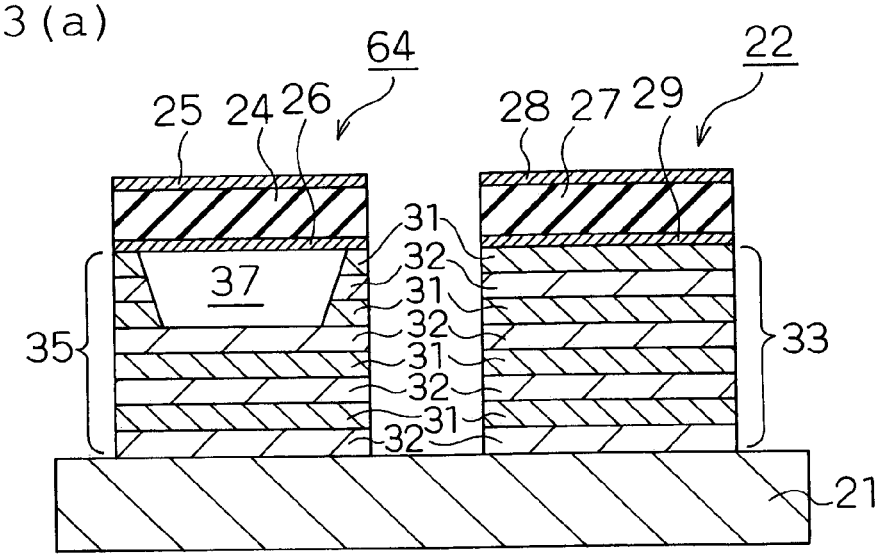
FIGS. 3(a) to 3(c) are sectional views of an acoustic resonator device according to a second embodiment of the present invention.

FIG. 3(a) is a sectional view of an acoustic resonator device including an acoustic resonator according to a second embodiment of the invention. Note that components same as those in FIG. 1 showing the structure of the acoustic resonator device of the first embodiment are denoted by the same reference numerals and an explanation of the component will be omitted. The acoustic resonator device of the second embodiment is the same as the acoustic resonator device of the first embodiment in the structure of the first acoustic resonator 22 and different from the acoustic resonator device of the first embodiment in a structure of a second resonator.

A second acoustic resonator 64 of the acoustic resonator device of the second embodiment includes, between the lower electrode layer 26 and the substrate 21, a second acoustic mirror 35 for confining resonance oscillation of the second acoustic resonator 64 in the second acoustic resonator 64. The second acoustic mirror 35 is provided on the substrate independently from the first acoustic mirror 33 and is formed in the identical film formation process together with the first acoustic mirror 33.

The structure of the piezoelectric layer 24 and the upper electrode layer 25 and the lower electrode layer 26 arranged above and below the piezoelectric layer 24 of the second acoustic resonator 64 is the same as that of the second acoustic resonator 23 according to the first embodiment. The first acoustic resonator 22 has the first resonant frequency $f_1$ and the second acoustic resonator 64 has the second resonant frequency $f_2$.

A cavity 37 is formed in a surface part of the second acoustic mirror 35 that is in contact with the lower electrode layer 26. With such a structure, it is possible to secure free oscillation of the second acoustic resonator 64 and to cause the second acoustic resonator 64 to resonate in the $\lambda/2$ mode.

In the acoustic resonator device of the second embodiment, since the first acoustic resonator 22 resonates in the $\lambda/4$ mode and the second acoustic resonator 64 resonates in the $\lambda/2$ mode, it is possible to design the acoustic resonator device such that resonant frequencies of the first acoustic resonator 22 and the second acoustic resonator 64 are far different from each other. As in the case of the first embodiment, since a thickness of the piezoelectric layer 24 and a thickness of the piezoelectric layer 27 are substantially the same, the relation of $f_2=2\times f_1$ is satisfied and the second acoustic resonator 64 resonates at a resonance frequency about twice as large as that of the first acoustic resonator 22.

In addition, as in the first embodiment, the thickness of the piezoelectric layer 24 and the thickness of the piezoelectric layer 27 are made substantially the same and a thickness of the lower electrode layer 29 and a thickness of the lower electrode layer 26 are made substantially the same. This means that the piezoelectric layer 24 and the piezoelectric layer 27 are formed simultaneously by an identical process using an identical material and the lower electrode layer 29 and the lower electrode layer 26 are formed simultaneously by an identical process using an identical material. Consequently, it is possible to remove qualitative fluctuation of the piezoelectric layers 24 and 27 and qualitative fluctuation of the lower electrode layers 29 and 26 and maintain identical performance in the first acoustic resonator 22 and the second acoustic resonator.

In other words, as in the acoustic resonator device according to the First embodiment, in the acoustic resonator device according to the second embodiment, it is possible to simplify a manufacturing process by setting the piezoelectric layers and the lower electrode layers to identical thicknesses, respectively, and manufacturing the piezoelectric layers and the lower electrode layers together. In addition, this embodiment realizes formation of the acoustic resonators, which have two resonance frequencies far different from each other and are capable of maintaining equivalent performance, on the identical substrate.

Figure 3B:
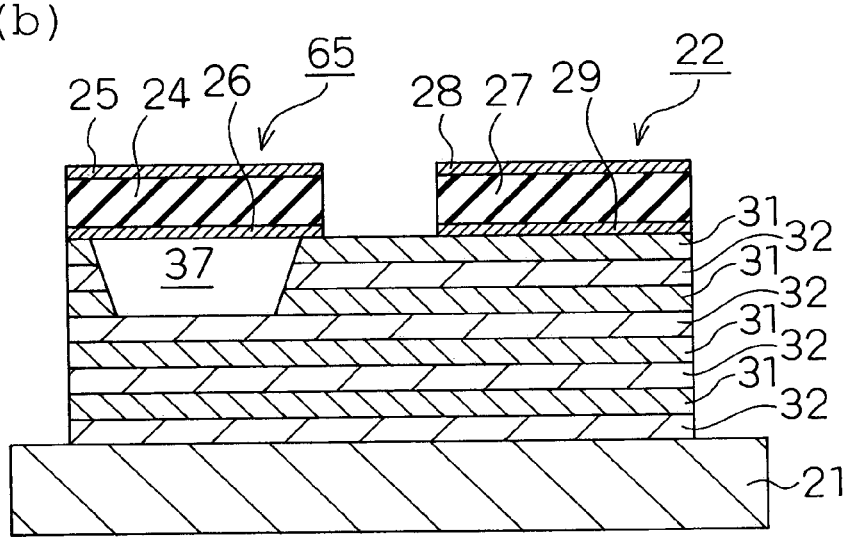
Figure 3C:
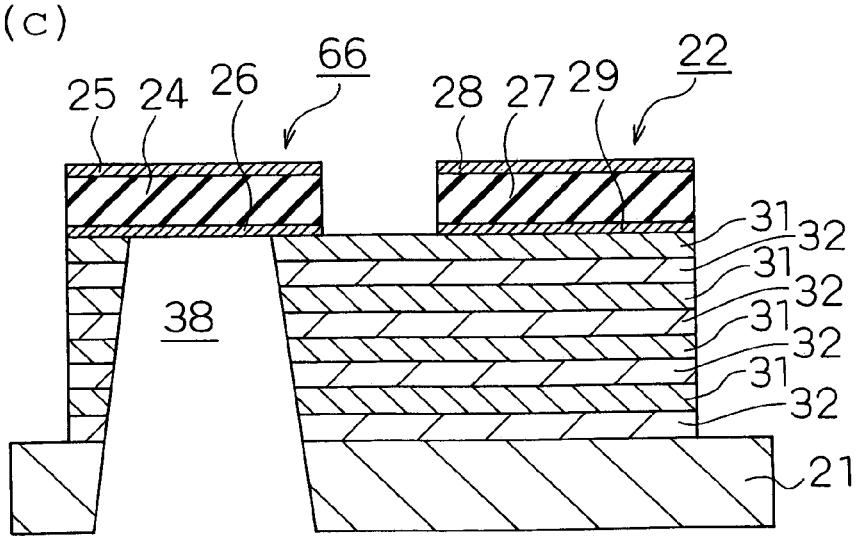

FIGS. 3(b) and 3(c) are sectional views of another structure of the acoustic resonator device according to the second embodiment.

In FIG. 3(b), the first acoustic impedance layers 31 and the second acoustic impedance layers 32 forming the acoustic mirror are constituted by continuous layers, which are not split between the first acoustic resonator 22 and the second acoustic resonator 65 such that the two acoustic resonators substantially share one acoustic impedance layer. With such a structure, it is possible to further simplify the manufacturing process than the case of FIG. 3(a).

In FIG. 3(c), a structure of a cavity of the second acoustic resonator 66 is made different from that in FIGS. 3(a) and 3(b). The cavity 37 in FIGS. 3(a) and 3(b) is a cavity provided in an upper part of the second acoustic mirror 35. However, a cavity 38 in FIG. 3(c) pierces through the substrate 21 and the acoustic mirror from the rear surface side of the substrate 21 to the lower electrode layer 26.

Note that, in FIGS. 3(b) and 3(c), components same as those in the acoustic resonator device in FIG. 3(a) are denoted by the same reference numerals and an explanation of the components will be omitted.

Note that, in the first acoustic mirror and the second acoustic mirror 35 according to the second embodiment, two kinds of layers, namely, the first acoustic impedance layer 31 and the second acoustic impedance layer 32 are stacked alternately. However, an acoustic mirror may have a structure in which three or more kinds of acoustic impedance layers with different acoustic impedances are stacked. As in the first embodiment, any structure of acoustic impedance layers may be adopted as long as an uppermost layer in contact with a lower electrode layer is a high acoustic impedance layer and a high acoustic impedance layer and a low acoustic impedance layer are staked alternately.

Third Embodiment

Figure 4:
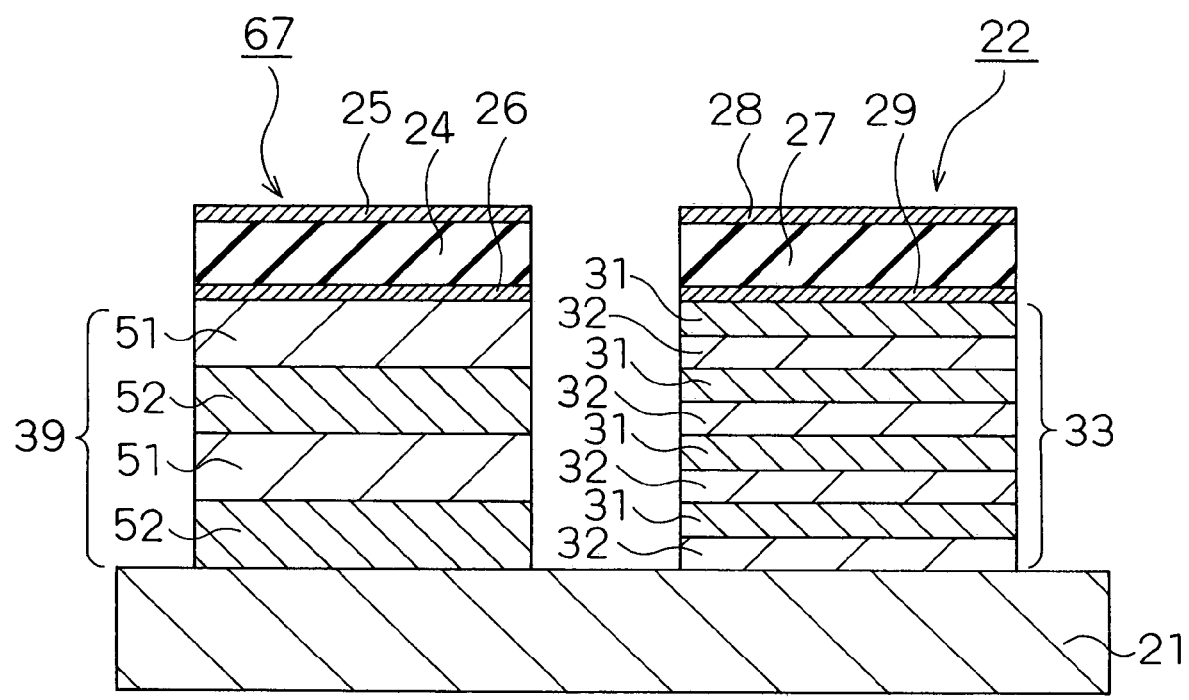
FIG. 4 is a sectional view of an acoustic resonator device according to a third embodiment of the present invention.

FIG. 4 is a sectional view of an acoustic resonator device including an acoustic resonator according to a third embodiment of the invention. Note that components same as those in FIG. 1 showing the structure of the acoustic resonator device according to the first embodiment are denoted by the same reference numerals and an explanation of the component will be omitted. The acoustic resonator device according to the third embodiment is identical with those in the first and the second embodiments in structure of piezoelectric layers and lower electrode layers. The acoustic resonator device according to the third embodiment is the same as the acoustic resonator device according to the first embodiment in the structure of the first acoustic resonator 22 but is different from the acoustic resonator device according to the first embodiment in a structure of a second acoustic resonator.

A second acoustic resonator 67 of the acoustic resonator device according to the third embodiment includes, between the lower electrode layer 26 and the substrate 21, a third acoustic mirror 39 for confining resonant oscillation of the second acoustic resonator 67 in the second acoustic resonator 67.

As in the first embodiment, the first acoustic resonator 22 has the first resonant $f_1$ and the second acoustic resonator 67 has the second resonant frequency $f_2$.

In the third acoustic mirror 39, a third acoustic impedance layer 51 and a fourth acoustic impedance layer 52 having different acoustic impedances are stacked alternately. Note that the third acoustic impedance layer 51 and the fourth acoustic impedance layer 52 are examples of second plural acoustic impedance layers of the present invention.

The third acoustic impedance layer 51 and the fourth acoustic impedance layer 52 have thicknesses half of acoustic wavelengths corresponding to sonic velocities of materials of the third acoustic impedance layer 51 and the fourth acoustic impedance layer 52, respectively. In addition, an acoustic impedance of the third acoustic impedance layer 51 is lower than an acoustic impedance of the fourth acoustic impedance layer 52 and the uppermost layer in contact with the lower electrode layer 26 is the third acoustic impedance layer 51. With such a structure, the second acoustic resonator 67 resonates in the $\lambda/2$ mode.

In the third embodiment, again, the first acoustic resonator 22 resonates in the $\lambda/2$ mode and the second acoustic resonator 67 resonates in the $\lambda/4$ mode. Thus, it is possible to make resonant frequencies of the first acoustic resonator 22 and the second acoustic resonator 67 far different from each other. In the third embodiment, since a thickness of the piezoelectric layer 24 and a thickness of the piezoelectric layer 27 are substantially the same, the relation of $f_2=2\times f_1$ is satisfied and the second acoustic resonator 67 resonates at a resonance frequency about twice as large as that of the first acoustic resonator 22.

Note that, in the third acoustic mirror 39 according to the third embodiment, the two kinds of layers, namely, the third acoustic impedance layer 51 and the fourth acoustic impedance layer 52 are stacked alternately. However, an acoustic mirror may have a structure in which three or more kinds of acoustic impedance layers with different acoustic impedances are stacked. Any structure of acoustic impedance layers may be adopted as long as an uppermost layer in contact with the lower electrode layer 26 is a low acoustic impedance layer and a low acoustic impedance layer and a high acoustic impedance layer are staked alternately.

Fourth Embodiment

Figure 5A:
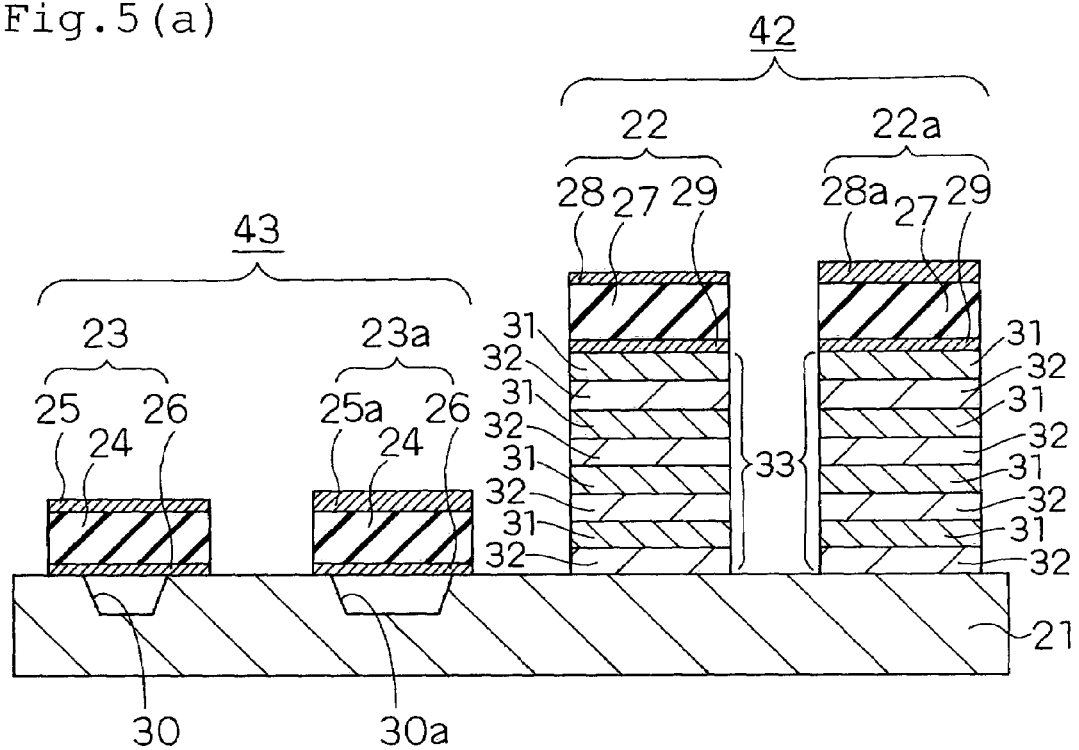
FIG. 5(a) is a sectional view of a filter device according to a fourth embodiment of the present invention.
Figure 5B:
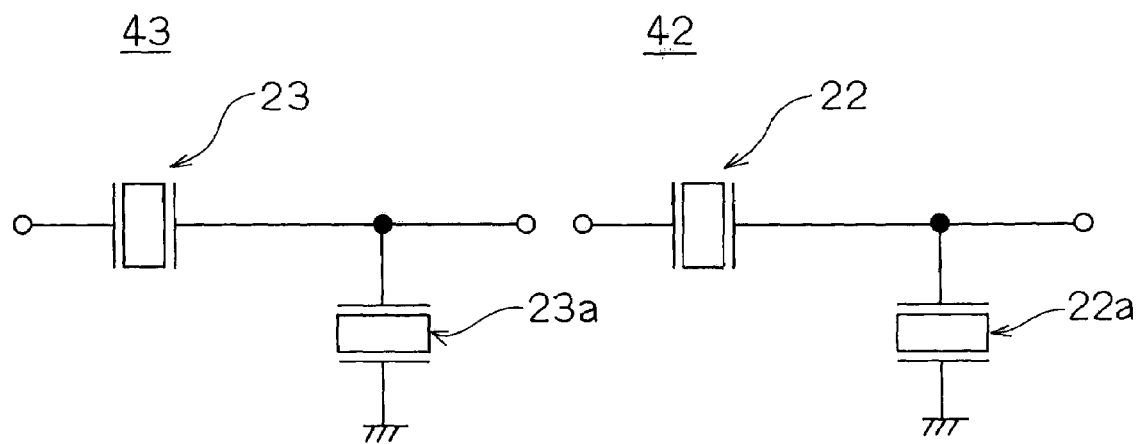
FIG. 5(b) is an equivalent circuit diagram of the filter device according to the fourth embodiment of the present invention.

FIG. 5(a) is a sectional view of a filter device according to a fourth embodiment of the invention, and FIG. 5(b) is an equivalent circuit diagram of the filter device. The filter device according to the fourth embodiment includes two filters, namely, a first filter 42 and a second filter 43. Note that components same as those in FIG. 1 showing the structure of the acoustic resonator device according to the first embodiment are denoted by the same reference numerals.

In the filter device according to the fourth embodiment, the first acoustic resonator 22 explained in the first embodiment and a first acoustic resonator 22a, which resonate in the $\lambda/4$ mode, and the second acoustic resonator 23 explained in the first embodiment and a second acoustic resonator 23a, which resonate in the $\lambda/2$ mode, are formed on one substrate 21.

The first acoustic resonator 22 has the first resonant frequency $f_1$ and the second acoustic resonator 23 has the second resonant frequency $f_2$. Both piezoelectric layers of the first acoustic resonator 22 and the first acoustic resonator 22a are the piezoelectric layers 27. A thickness of the piezoelectric layers 27 is a quarter of the acoustic wavelength of the first resonant frequency $f_1$. In addition, both piezoelectric layers of the second acoustic resonator 23 and the second acoustic resonator 23a are the piezoelectric layers 24. A thickness of the piezoelectric layers 24 is half of the acoustic wavelength of the second resonant frequency $f_2$.

Therefore, structures of the respective piezoelectric layers and the respective lower electrode layers are identical with those in the first to the third embodiment.

According to such an acoustic resonator device, in addition to the effects of the first embodiment, for example, an upper electrode layers 25a of the second acoustic resonator 23a is made thicker than the upper electrode layer 25 of the second acoustic resonator 23, whereby it is possible to cause the second acoustic resonator 23a to resonate at a resonant frequency lower than the resonant frequency $f_2$ of the second acoustic resonator 23. In addition, for example, an upper electrode layer 28a of the first acoustic resonator 22a is made thicker than the upper electrode layer 28 of the first acoustic resonator 22, whereby it is possible to cause the first acoustic resonator 22a to resonate at a resonant frequency lower than the resonant frequency $f_1$ of the first acoustic resonator 22.

The first filter 42 is constituted by a combination of the first acoustic resonator 22 and the first acoustic resonator 22a and the second filter 43 is constituted by a combination of the second acoustic resonator 23 and the second acoustic resonator 23a.

In the fourth embodiment, a thickness of the upper electrode layer 28a is made different from a thickness of the upper electrode layer 28, whereby resonant frequencies of the first acoustic resonator 22 to be a series resonator and the first acoustic resonator 22a to be a parallel resonator are made different. Similarly, a thickness of the upper electrode layer 25a is made different from a thickness of the upper electrode layer 25, whereby resonant frequencies of the second acoustic resonator 23 to be a series resonator and the second acoustic resonator 23a to be a parallel resonator are made different.

However, the present invention does not limit a method of making resonant frequencies of two acoustic resonators different to the method of changing thickness of upper electrode layers in this way. For example, it is also possible that a piezoelectric layer of the first acoustic resonator 22 and a piezoelectric layer of the first acoustic resonator 22a are made different, and a piezoelectric layer of the second acoustic resonator 23 and a piezoelectric layer of the second acoustic resonator 23a are made different, whereby resonant frequencies of acoustic resonators are made different. In addition, it is also possible that a size of the cavity 30 of the second acoustic resonator 23 and a size of a cavity 30a of the second acoustic resonator 23a are made different, whereby resonant frequencies of the second acoustic resonator 23 and the second acoustic resonator 23a are made different.

In addition, in the filter device of the fourth embodiment, filters with substantially equal thicknesses of piezoelectric layers and frequencies different from each other by twofold are realized. However, it is also possible to further increase a degree of freedom for making frequencies different by combining the acoustic resonator of the invention and the technique for making piezoelectric layers different. This is not limited to a ladder type but is possible in other types. The filter device may be applied to a single acoustic resonator.

Fifth Embodiment

Figure 6:
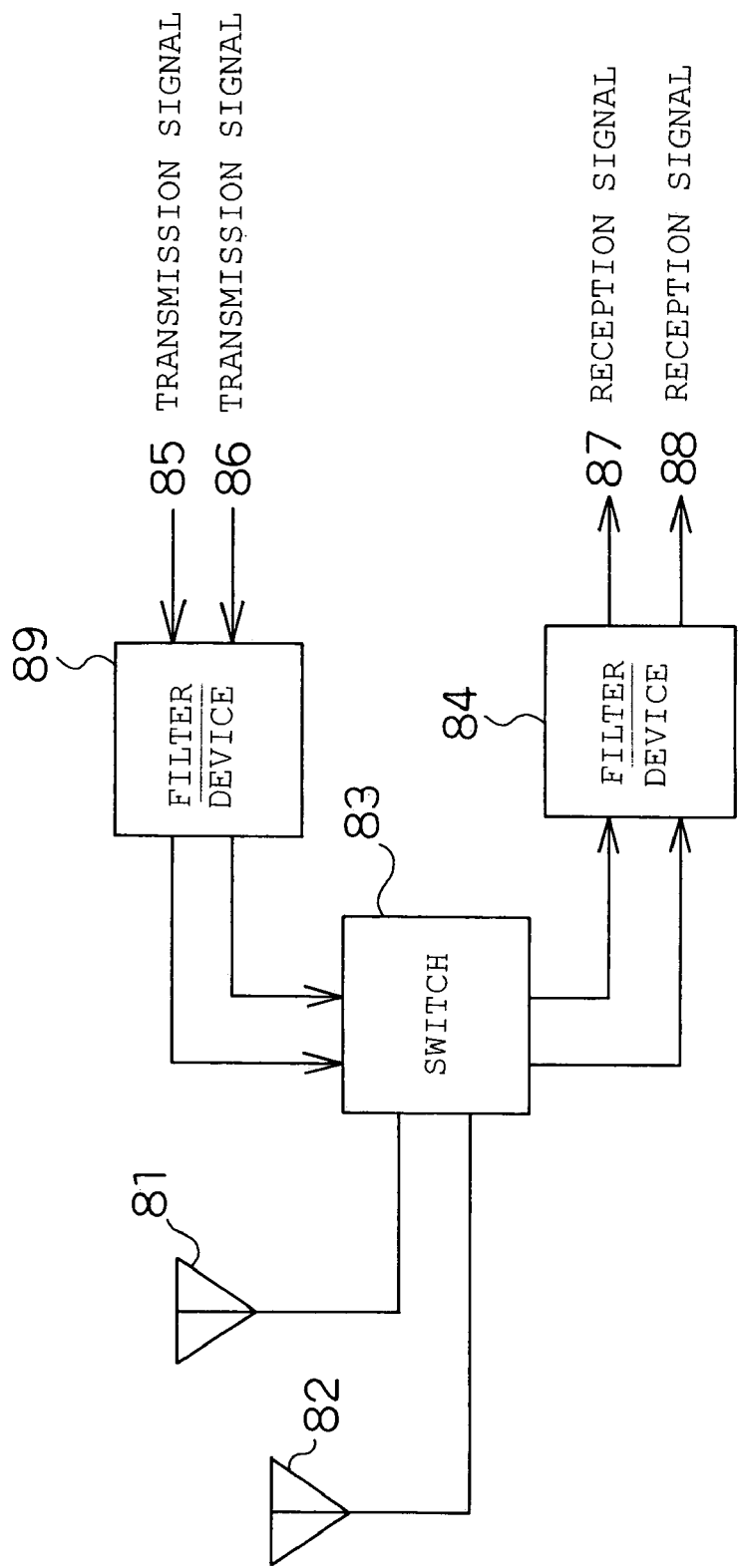
FIG. 6 is a block diagram of a communication apparatus according to a fifth embodiment of the present invention.
Figure 7A:
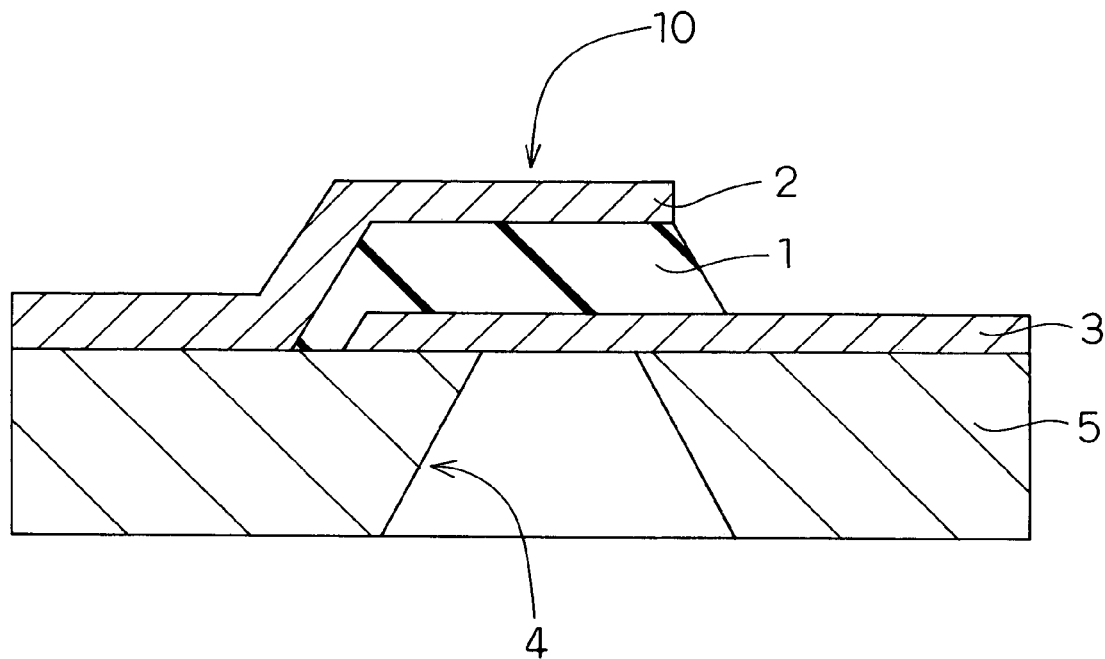
FIG. 7(a) is a schematic sectional view of a conventional thin-film acoustic resonator.
Figure 7B:
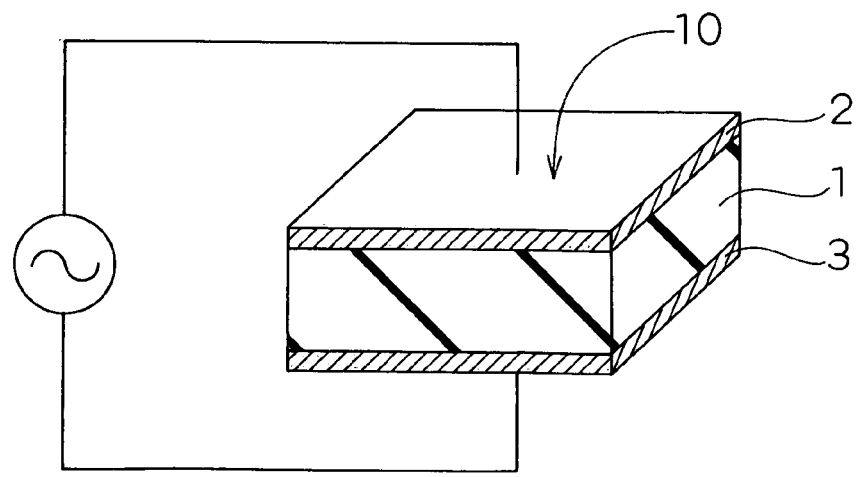
FIG. 7(b) is a schematic perspective view for explaining an operation of the conventional thin-film acoustic resonator.
Figure 8A:
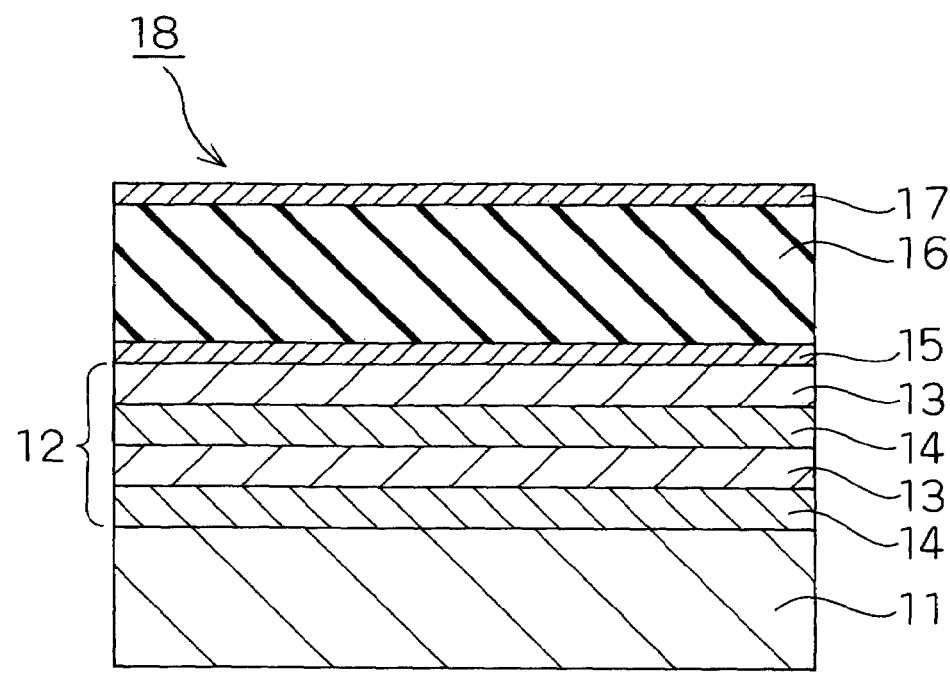
FIG. 8(a) is a sectional view of a $\lambda/2$ mode resonator using a conventional acoustic mirror.
Figure 8B:
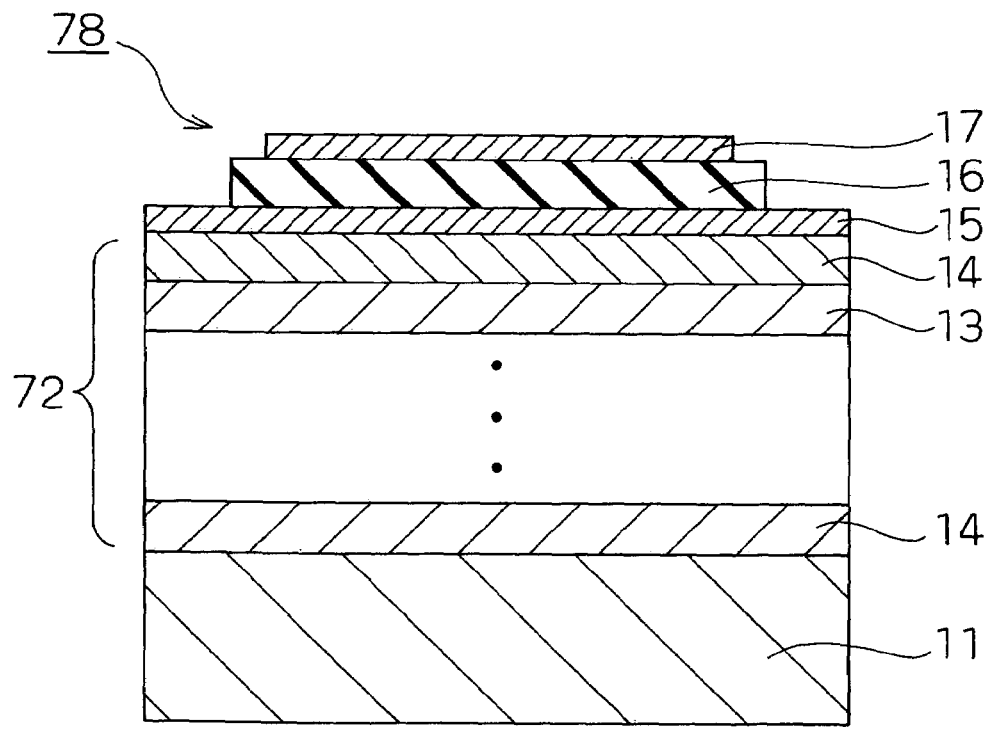
FIG. 8(b) is a sectional view of a $\lambda/4$ mode resonator using the conventional acoustic mirror.
Figure 9:
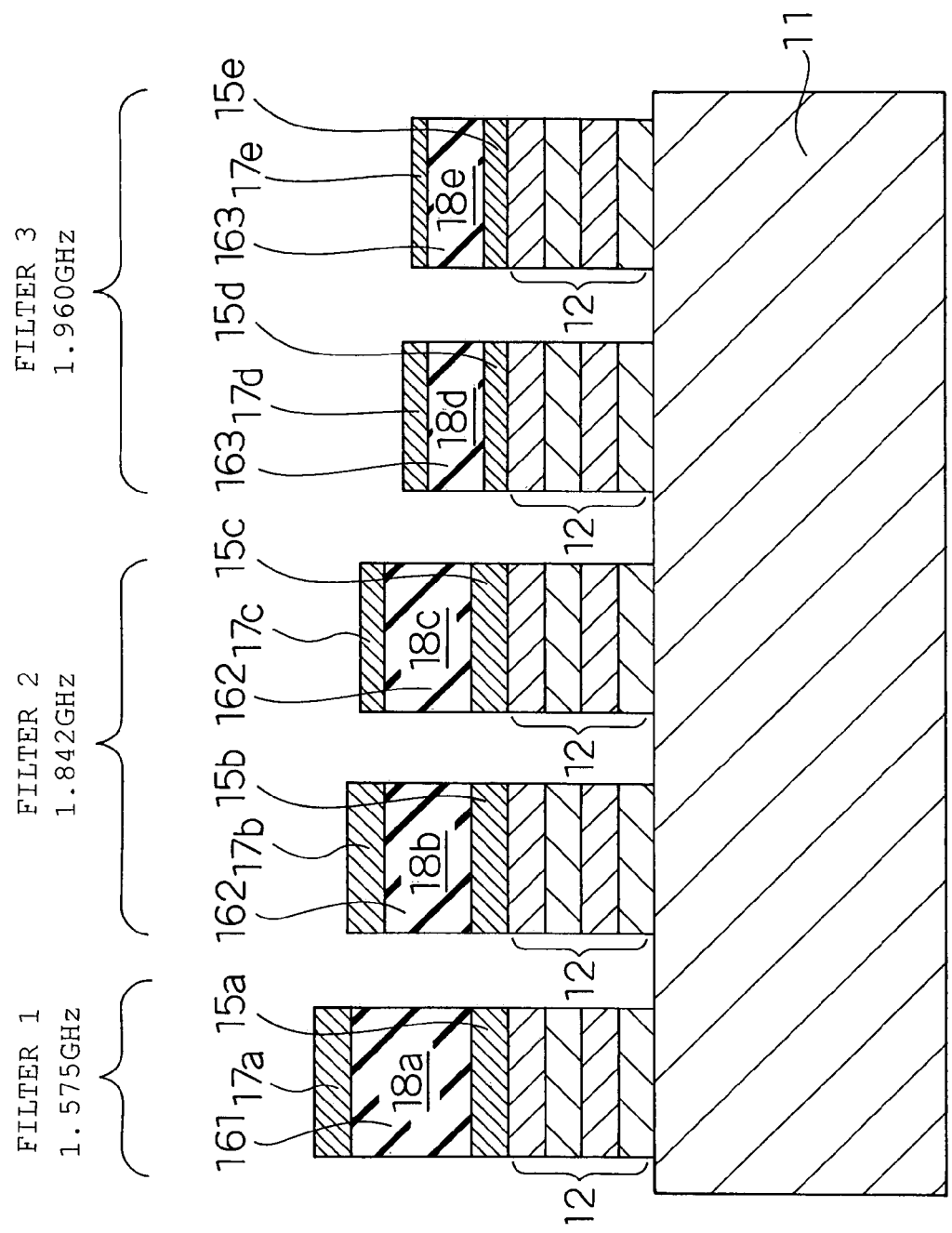
FIG. 9 is a sectional view of a conventional thin-film acoustic resonator device.

FIG. 6 is a block diagram of a communication apparatus according to a fifth embodiment using the acoustic resonator device of the present invention.

A filter device 84 and a filter device 89 of the communication apparatus according to the fifth embodiment are identical filter devices. These filter devices use the filer device according to the fourth embodiment and are two types of filters with center frequencies of pass bands different from each other by about twofold.

The communication apparatus according to the fifth embodiment is connected to two antennas 81 and 82 that transmit and receive radio waves. The antenna 82 transmits and receives radio waves with frequencies twice as large as those of the antenna 81. A switch 83 switches connection between the antennas 81 and 82 and transmission signals 85 and 86 or reception signals 87 and 88.

Both the filter device 84 and the filter device 89 are constituted by two types of filters, namely, the first filer 42 and the second filter 43 shown in FIG. 5. Since the filter device 84 has two types of filters with frequencies different from each other by about twofold, when radio waves are received, the filter device 84 can handle the reception signal 87 and the reception signal 88, which has frequencies about twice as large as those of the reception signal 87, simultaneously. Similarly, since the filter device 89 also has two types of filters with frequencies different from each other by about twofold, when radio waves are transmitted, the filter device 89 can handle the transmission signal 85 and the transmission signal 86, which has frequencies about twice as large as those of the transmission signal 85, simultaneously.

Note that a combination of the filter device 84 and the switch 83 is an example of a reception circuit of the present invention. In addition, a combination of the filter device 89 and the switch 83 is an example of a reception circuit of the present invention. Note that only one antenna may be provided.

Note that the communication apparatus according to the fifth embodiment is mobile communication apparatus which transmits and receives signals by radio. However, the present invention does not limit a transmission and reception method, and the communication apparatus may be a communication apparatus that transmits and receives signals by wire.

Note that the contents explained in the embodiments are illustrations in all respects and are not restrictive.

For example, in the above explanation, in the acoustic resonator device, the acoustic resonators are mainly the two acoustic resonators, namely, the first acoustic resonator that resonates in the $\lambda/4$ mode and the second acoustic resonator that resonates in the $\lambda/2$ mode. However, the number and oscillation modes of the acoustic resonators are not limited to this. The present invention may be carried out in an acoustic resonator, which resonates in an arbitrary oscillation mode and at a resonant frequency corresponding to the oscillation mode, as long as thicknesses of respective piezoelectric layers can be made identical. The present invention can be carried out even if all acoustic resonators in an acoustic resonator device resonate at resonant frequencies, all of which are different, or part of acoustic resonators resonate at different resonant frequencies.

As explained above, the acoustic resonator device, the filter device, and the communication apparatus in the embodiments of the present invention realizes the structure of the acoustic resonator having two resonant frequencies far different from each other on an identical substrate by providing the first acoustic resonator, which resonates in the λ/4 mode, and the second acoustic resonator, which resonates in the λ/2 mode, on the identical substrate. In addition, the invention realizes simplification of a manufacturing process by making thicknesses of piezoelectric layers of acoustic resonators having different resonant frequencies substantially the same.

In the acoustic resonator device, the filter device, the manufacturing method for the acoustic resonator device, and the communication apparatus according to the present invention, it is possible to obtain an acoustic resonator device and the like in which plural acoustic resonators, which have at least two resonant frequencies far different from each other on an identical substrate and can suppress deterioration of performance, are formed. The acoustic resonator device or the like are useful as, for example, a communication apparatus, a module, a shared device, and a wireless LAN.

What is claimed is:

1. An acoustic resonator device, comprising:
   a substrate; and
   plural acoustic resonators that are formed on the substrate and have upper electrode layers, piezoelectric layers, and lower electrode layers, wherein
   all or part of the plural acoustic resonators resonate in resonance modes different from each other and at resonant frequencies corresponding to the resonance modes, and
   materials and thicknesses of the piezoelectric layers are common and substantially equal,
   the plural acoustic resonators are:
   a first acoustic resonator that has a first upper electrode layer, a first piezoelectric layer, and a first lower electrode layer and resonates in a λ/4 mode and at a first resonant frequency; and
   the first acoustic resonator has a first acoustic mirror that is provided between the first lower electrode layer and the substrate and has a structure in which first plural acoustic impedance layers are deposited,
   all the first plural acoustic impedance layers have a thickness substantially a quarter wavelength of the first resonant frequency, and
   among the first plural acoustic impedance layers, an acoustic impedance layer of an uppermost layer adjacent to the first lower electrode layer has an impedance higher than that of an acoustic impedance layer adjacent to an opposite side of the first lower electrode layer,
   a second acoustic resonator that is formed on the substrate, has a second upper electrode layer, a second piezoelectric layer, and a second lower electrode layer, and resonates in a λ/2 mode and at a second resonant frequency different from the first frequency,
   the second acoustic resonator has a second acoustic mirror having a same structure as the first acoustic mirror between the second lower electrode layer and the substrate, and
   a cavity is provided under the second lower electrode layer of the second acoustic mirror.

2. The acoustic resonator device according to claim 1, wherein
   the first acoustic mirror and the second acoustic mirror share the first plural acoustic impedance layers, and
   the first lower electrode layer of the first acoustic resonator and the second lower electrode layer of the second acoustic resonator are provided on an uppermost layer of an identical one of the first plural acoustic impedance layers.

3. The acoustic resonator device according to claim 1, wherein the first acoustic mirror and the second acoustic mirror are provided on the substrate independently from each other.

4. An acoustic resonator device, comprising: a substrate; and
   plural acoustic resonators that are formed on the substrate and have upper electrode layers, piezoelectric layers, and lower electrode layers, wherein
   all or part of the plural acoustic resonators resonate in resonance modes different from each other and at resonant frequencies corresponding to the resonance modes, and
   materials and thicknesses of the piezoelectric layers are common and substantially equal,
   the plural acoustic resonators are:
   a first acoustic resonator that has a first upper electrode layer, a first piezoelectric layer, and a first lower electrode layer and resonates in a λ/4 mode and at a first resonant frequency; and
   a second acoustic resonator that is formed on the substrate, has a second upper electrode layer, a second piezoelectric layer, and a second lower electrode layer, and resonates in a λ/2 mode and at a second resonant frequency different from the first frequency,
   the second acoustic resonator has a third acoustic mirror, which has a structure in which second plural acoustic impedance layers are deposited, between the second lower electrode layer and the substrate, all the second plural acoustic impedance layers have a thickness substantially half wavelength of the second resonant frequency, and an acoustic impedance layer of an uppermost layer adjacent to the second lower electrode layer among the second plural acoustic impedance layer has an impedance lower than that of an acoustic impedance layer adjacent to an opposite side of the second lower electrode layer.

5. An acoustic resonator device as in one of claim 1 to 4, said acoustic resonator device included in a filter device that includes plural filters having different operation frequencies on one substrate.

6. An acoustic resonator device as in claim 5, at least one of said filters included in at least one of
   a transmission circuit; and
   a reception circuit.

* * * * *